(12) United States Patent
Li

(10) Patent No.: US 12,490,492 B2
(45) Date of Patent: Dec. 2, 2025

(54) MANUFACTURING METHOD OF SEMICONDUCTOR STRUCTURE

(71) Applicant: UNITED MICROELECTRONICS CORP., Hsin-Chu (TW)

(72) Inventor: Shin-Hung Li, Nantou County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 395 days.

(21) Appl. No.: 18/125,136

(22) Filed: Mar. 23, 2023

(65) Prior Publication Data

US 2023/0231033 A1    Jul. 20, 2023

Related U.S. Application Data

(62) Division of application No. 17/347,614, filed on Jun. 15, 2021, now Pat. No. 11,640,981.

(30) Foreign Application Priority Data

May 13, 2021    (CN) .......................... 202110521137.1

(51) Int. Cl.
*H01L 29/66* (2006.01)
*H01L 21/02* (2006.01)
(Continued)

(52) U.S. Cl.
CPC .... *H01L 29/42368* (2013.01); *H01L 21/0223* (2013.01); *H01L 21/76224* (2013.01);
(Continued)

(58) Field of Classification Search
CPC ............. H01L 29/42368; H01L 29/401; H01L 29/66568; H01L 29/7836; H01L 21/2652; H01L 21/28211; H01L 21/28158–28238; H01L 29/51–518; H01L 29/66833–6684; H01L 29/792–7926; H01L 21/0223;
(Continued)

(56) References Cited

U.S. PATENT DOCUMENTS 6,087,237 A    7/2000    Hwang
6,147,008 A    11/2000    Chwa
(Continued)

FOREIGN PATENT DOCUMENTS

| CN | 104966735 A | 10/2015 |
|---|---|---|
| CN | 104979390 A | 10/2015 |
| JP | 2015-149355 | 8/2015 |

*Primary Examiner* — Shahed Ahmed
(74) *Attorney, Agent, or Firm* — Winston Hsu

(57) ABSTRACT

The invention provides a manufacturing method of a semiconductor structure, the method includes providing a substrate, forming two shallow trench isolation structures in the substrate. A first region, a second region and a third region are defined between the two shallow trench isolation structures, and the second region is located between the first region and the third region. Next, an oxide layer is formed in the first region, the second region and the third region, and the oxide layer directly contacts the two shallow trench isolation structures. The oxide layer in the second region is then removed, and another oxide layer is formed in the first region, the second region and the third region, so that a thick oxide layer is formed in the first and third regions, and a thin oxide layer is formed in the second region.

10 Claims, 5 Drawing Sheets

(51) Int. Cl.
  *H01L 21/762*   (2006.01)
  *H01L 29/40*    (2006.01)
  *H01L 29/423*   (2006.01)
  *H01L 29/78*    (2006.01)
  *H01L 21/265*       (2006.01)
  *H01L 21/28*        (2006.01)

(52) U.S. Cl.
  CPC ...... *H01L 29/401* (2013.01); *H01L 29/66492* (2013.01); *H01L 29/66568* (2013.01); *H01L 29/7836* (2013.01); *H01L 21/2652* (2013.01); *H01L 21/28211* (2013.01)

(58) Field of Classification Search
  CPC ......... H01L 21/76224; H01L 29/66492; H01L 29/0603; H01L 21/02126–0214; H01L 21/02164; H01L 21/30604–30621; H01L 21/02019; H10D 64/516; H10D 30/022; H10D 30/027; H10D 30/605; H10D 64/01; H10D 30/0229; H10D 84/0153; H10D 84/619
  See application file for complete search history.

(56)         References Cited

U.S. PATENT DOCUMENTS

| 6,281,558 B1       | 8/2001  | Sayama                  |
| 9,929,056 B1       | 3/2018  | Tsai                    |
| 10,297,455 B2      | 5/2019  | Hsiao                   |
| 2011/0248356 A1*   | 10/2011 | Smith ............... H10B 20/00 |
|                    |         | 257/E27.102             |
| 2014/0001540 A1*   | 1/2014  | Wang ............. H01L 21/823857 |
|                    |         | 257/329                 |
| 2019/0355614 A1*   | 11/2019 | Liew ............... H01L 21/0332 |
| 2019/0355837 A1*   | 11/2019 | Liew ............... H01L 21/31111 |

* cited by examiner

US 12,490,492 B2

MANUFACTURING METHOD OF SEMICONDUCTOR STRUCTURE

CROSS REFERENCE TO RELATED APPLICATIONS

This application is a division of U.S. application Ser. No. 17/347,614, filed on Jun. 15, 2021. The content of the application is incorporated herein by reference.

BACKGROUND OF THE INVENTION

1. Field of the Invention

The present invention relates to the field of semiconductors, in particular to a structure and a manufacturing method of a double diffusion drain metal oxide semiconductor (DDDMOS) with oxide layers with different thicknesses.

2. Description of the Prior Art

Double diffusion drain metal oxide semiconductors (DDDMOS) are usually used as the working element and/or electrostatic protection (ESD) element of high voltage circuits.

In the manufacture of high voltage integrated circuits, double diffusion drain metal oxide semiconductor (DDDMOS) array is often used to provide large output current. Because DDDMOS introduces high voltage, it will produce a strong electric field, especially near the edge of the gate structure, which may cause the electric field to pass through the gate structure and cause damage to the device.

Therefore, an improved DDDMOS structure is needed, which can reduce the probability of the above problems.

SUMMARY OF THE INVENTION

The invention provides a semiconductor structure, the semiconductor structure includes a substrate, two shallow trench isolation structures are located in the substrate, a first region, a second region and a third region are defined between the two shallow trench isolation structures, the second region is located between the first region and the third region, two thick oxide layers are respectively located in the first region and the third region and directly contact the two shallow trench isolation structures respectively, and a thin oxide layer is located in the second region The invention also provides a manufacturing method of a semiconductor structure, the method includes providing a substrate, forming two shallow trench isolation structures in the substrate. A first region, a second region and a third region are defined between the two shallow trench isolation structures, and the second region is located between the first region and the third region. Next, an oxide layer is formed in the first region, the second region and the third region, and the oxide layer directly contacts the two shallow trench isolation structures. The oxide layer in the second region is then removed, and another oxide layer is formed in the first region, the second region and the third region, so that a thick oxide layer is formed in the first and third regions, and a thin oxide layer is formed in the second region.

According to the embodiment of the present invention, a part of the buffer oxide layer is left on the left and right sides of the DDDMOS structure near the shallow trench isolation, and when another new oxide layer is subsequently formed, an oxide layer with thinner center and thicker left and right sides will be formed under the gate structure. The thick oxide layers on the left and right sides can effectively protect the gate structure from breakdown by high current, while the thin oxide layers remain in the central part, which can also avoid the influence of Kirk effect.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
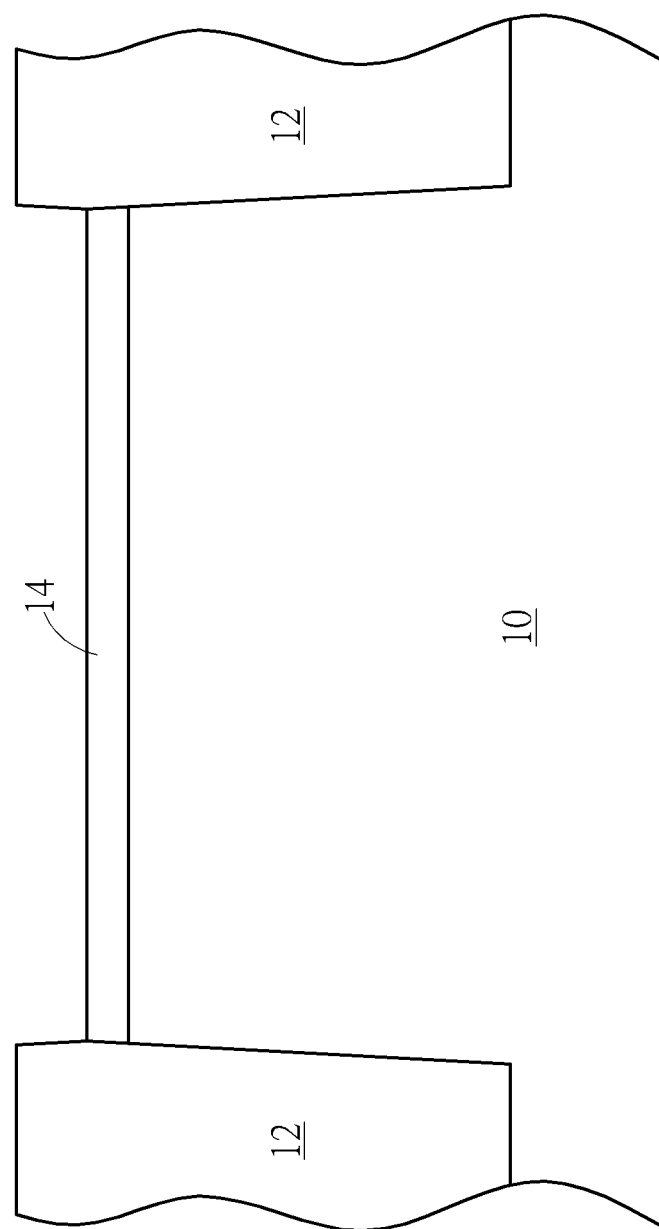
FIG. 1 to FIG. 5 are schematic cross-sectional diagrams of fabricating a double diffusion drain metal oxide semiconductor (DDDMOS) according to the preferred embodiment of the present invention.

FIG. 1 to FIG. 5 are schematic cross-sectional diagrams of fabricating a double diffusion drain metal oxide semiconductor (DDDMOS) according to the preferred embodiment of the present invention. As shown in FIG. 1, a substrate 10, such as a silicon substrate, is first provided, and then at least two shallow trench isolation structures 12 are formed in the substrate 10. The material of the shallow trench isolation structures 12 is, for example, silicon oxide, and parts of the shallow trench isolation structures 12 is located in the substrate 10 (i.e., penetrates into the substrate 10), while the other part protrudes from the surface of the substrate 10. In addition, a buffer oxide layer 14 is formed between the two shallow trench isolation structures 12. Preferably, the buffer oxide layer 14 and the shallow trench isolation structure can be formed at the same time (for example, the buffer oxide layer 14 can be the pad oxide which is formed with the shallow trench isolation structure 12 is formed), but the present invention is not limited to this. The buffer oxide layer 14 serves to protect the substrate 10 in the subsequent ion doping step.

Figure 2:
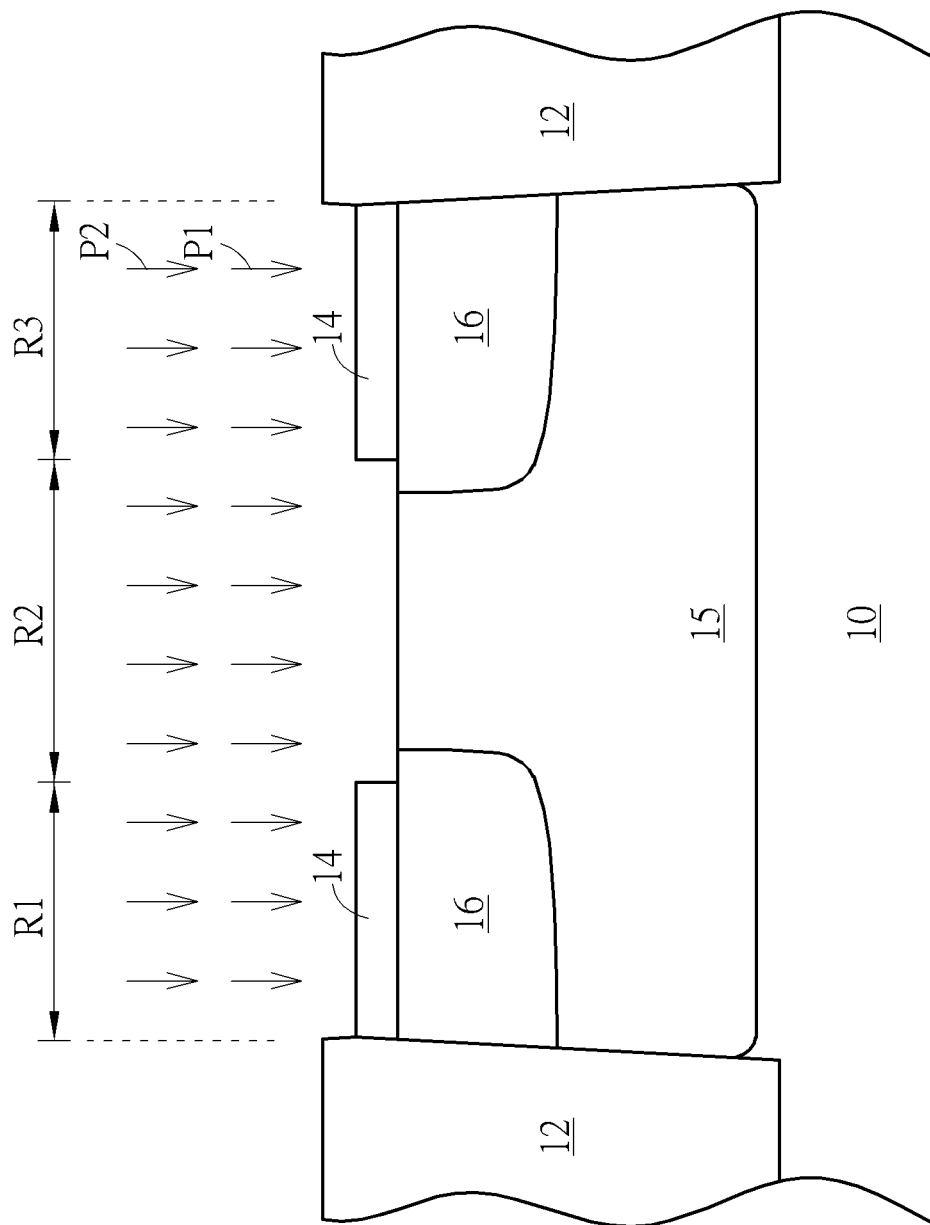

Then, as shown in FIG. 2, an ion doping step P1 is performed to form at least one doped region 15 and a lightly doped region 16 in the substrate 10, the doped region 15 and the lightly doped region 16 contain suitable ions, such as III-V ions, etc. The doped region 15 is a well region, and the lightly doped region 16 can be used as a lightly doped drain (LDD) in the subsequent DDDMOS. Then, a patterning step P2 is performed, for example, using a mask (not shown) combined with an exposure development and etching step to remove part of the buffer oxide layer 14. More specifically, the buffer oxide layer 14 can be defined as a first region R1, a second region R2 and a third region R3 on the substrate 10, the second region R2 is located between the first region R1 and the third region R3. After the patterning step P2 is performed, the buffer oxide layer 14 in the second region R2 is removed, but the buffer oxide layer 14 in the first region R1 and the third region R3 still remains.

In the above steps, the ion doping step P1 is firstly performed to form the lightly doped region 16, and then the patterning step P2 is performed. However, in other embodiments of the present invention, the ion doping step P1 may also be performed after the patterning step P2 is performed, and this process is also within the scope of the present invention.

It is worth noting that in the conventional technology, after the lightly doped region 16 is formed, the patterning step P2 is not performed to partially remove the buffer oxide layer 14 in the second region R2, but the entire buffer oxide layer 14 is completely removed, and then a new oxide layer is regenerated. One of the characteristics of the present invention is that after the patterning step P2, only a part of the buffer oxide layer 14 (that is, the buffer oxide layer 14 in the second region R2) is removed, and at the same time, the portion of the buffer oxide layer 14 adjacent to the shallow trench isolation structure 12 (that is, the buffer oxide layer 14 in the first region R1 and the third region R3) still remains. In this way, a part of the left buffer oxide layer 14 will subsequently form the thick oxide layers under both sides of the gate structure to better protect the gate structure.

Figure 3:
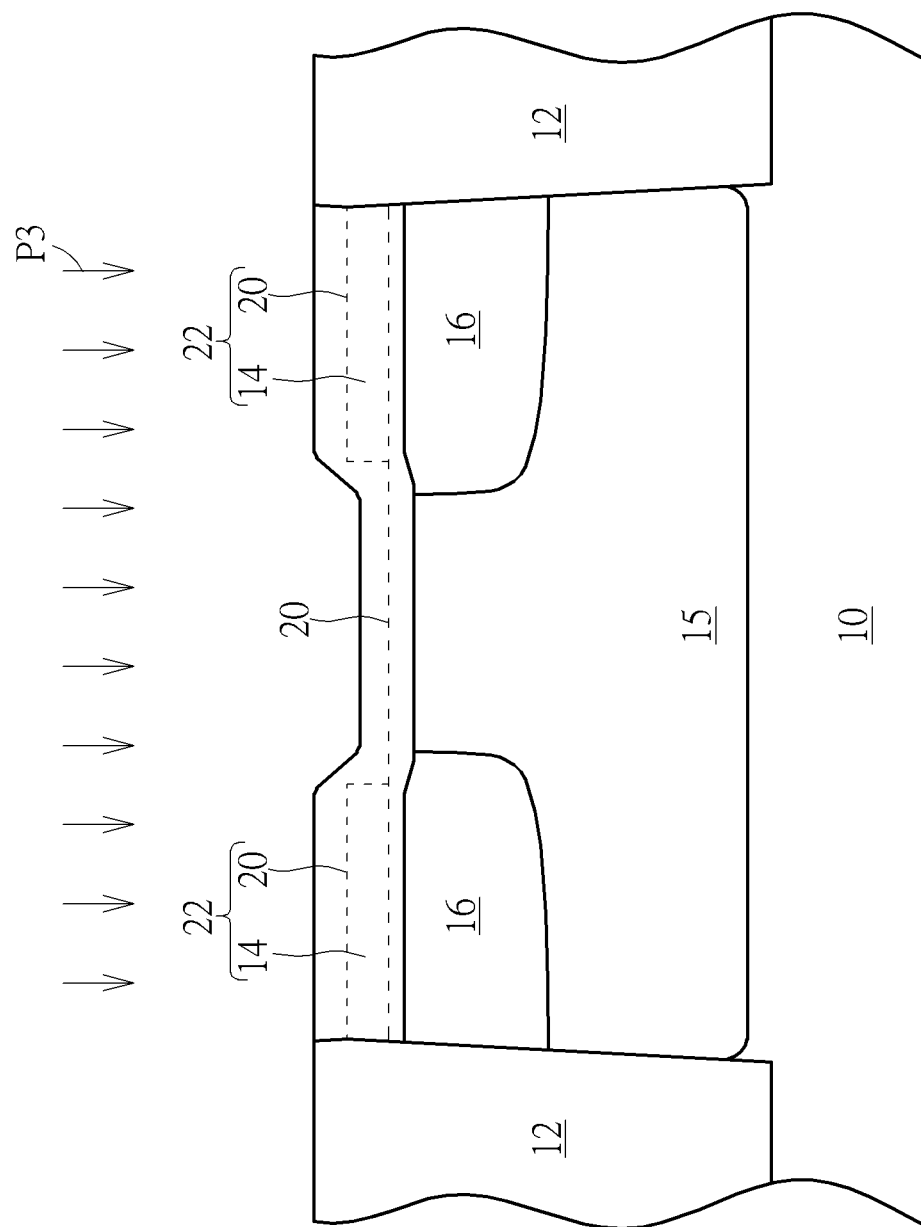

As shown in FIG. 3, an oxide layer 20 is regenerated on the substrate 10 by a heating step P3. In this embodiment, the heating step is, for example, the in-situ steam generation (ISSG), which raises the temperature to about 140 degrees Celsius in an environment containing oxygen (such as mixed gas containing hydrogen and oxygen, oxygen, ozone, water vapor, etc.), but is not limited to this. The material of the oxide layer 20 is, for example, silicon oxide, and grows along the surface of the substrate 10 and the buffer oxide layer 14 previously left. Therefore, after the heating step P3 is performed, the thickness of the buffer oxide layer 14 in the original first region R1 and third region R3 increases (because a new oxide layer 20 is formed on the surface), and the oxide layer 20 is regenerated in the original second region R2.

In this embodiment, since the buffer oxide layer 14 and the oxide layer 20 are made of silicon oxide, they are made of the same material, and the interface between them is indicated by a dashed line. However, it can be understood that the buffer oxide layer 14 and the oxide layer 20 are formed separately in different steps. In addition, since the buffer oxide layer 14 is formed by deposition, its density may be lower than that of the oxide layer 20 formed by ISSG. However, during the heating step P3, the buffer oxide layer 14 may be heated again to increase the density. In addition, after the oxide layer 20 is formed, the buffer oxide layer 14 and the oxide layer 20 in the first region R1 and the third region R3 can be combined and defined as a thick oxide layer 22, while the oxide layer 20 in the second region R2 is thinner than the thick oxide layer 22, so it can also be defined a thin oxide layer 20.

In addition, in this embodiment, except for changing the temperature of the heating step P3, the thickness of the oxide layer 20 can also be adjusted by adjusting the oxygen-containing ratio of the introduced gas. Preferably, the thickness of the thick oxide layer 22 is about 10%-30% greater than the thickness of the thin oxide layer 20, but not limited to this.

In addition, it is worth noting that during the heating step P3, oxygen reacts with silicon in the substrate to form the silicon oxide layer (i.e., the oxide layer 20), so part of the oxide layer 20 will sink into the surface of the substrate 10. Especially in the second region R2, the bottom surface of the oxide layer 20 will be lower than the top surface of the substrate 10 in the first region R1 or the third region R3. In the present invention, the oxide layer 20 in the second region R2 forms a concave cross-sectional structure, which is helpful to provide better electric field protection for the subsequently formed gate structure.

Figure 4:
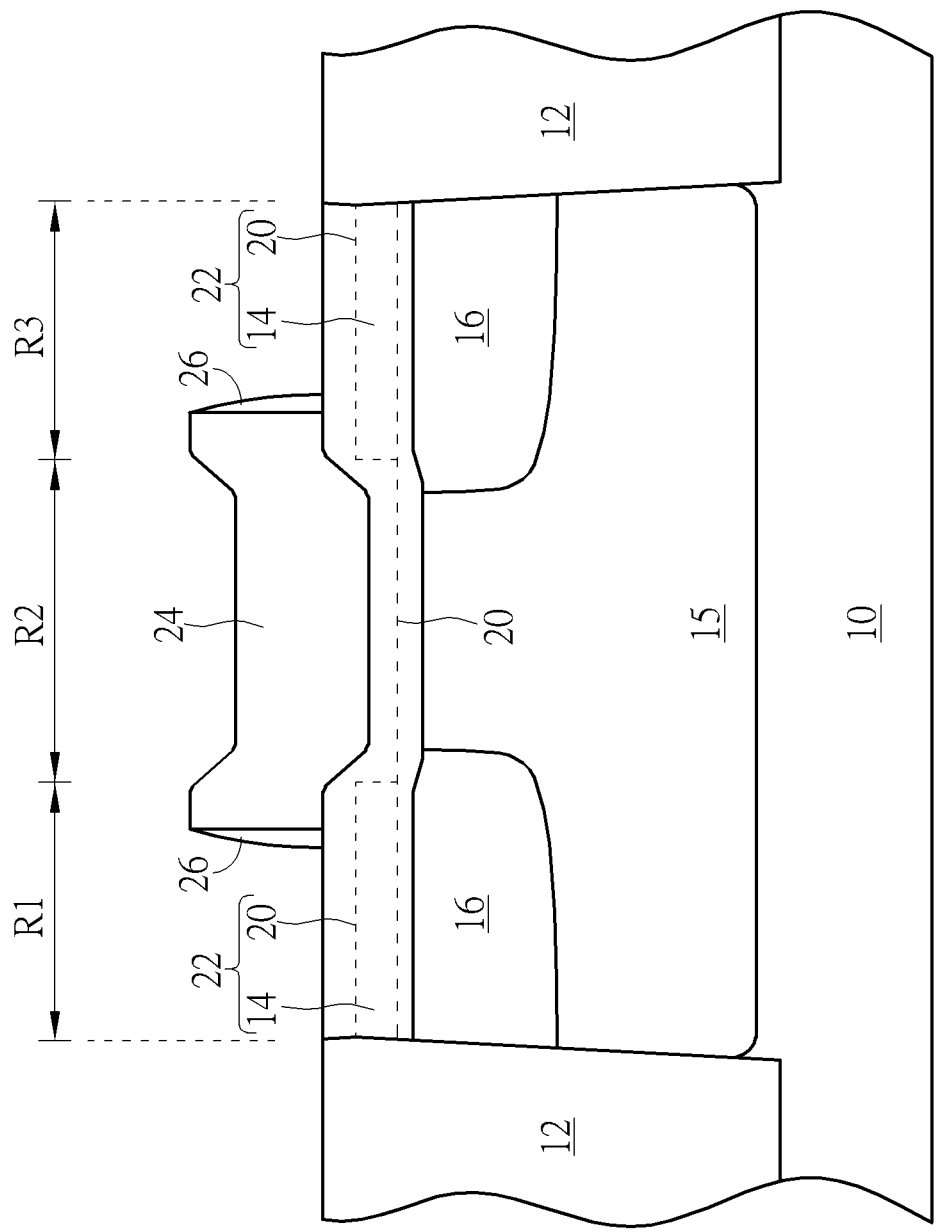

Then, as shown in FIG. 4, a gate structure 24 is formed on the oxide layer 20, the gate structure 24 is mainly located in the second region R2, but parts of the gate structure 24 is also located in the first region R1 and the third region R3. The gate structure 24 spans a part of the thick oxide layer 22, and the gate structure 24 is also located on the thin oxide layer 20. The gate structure 24 may be a polysilicon gate, but not limited thereto. In addition, spacers 26 can be formed on both sides of the gate structure 24, which can protect the gate structure 24.

Figure 5:
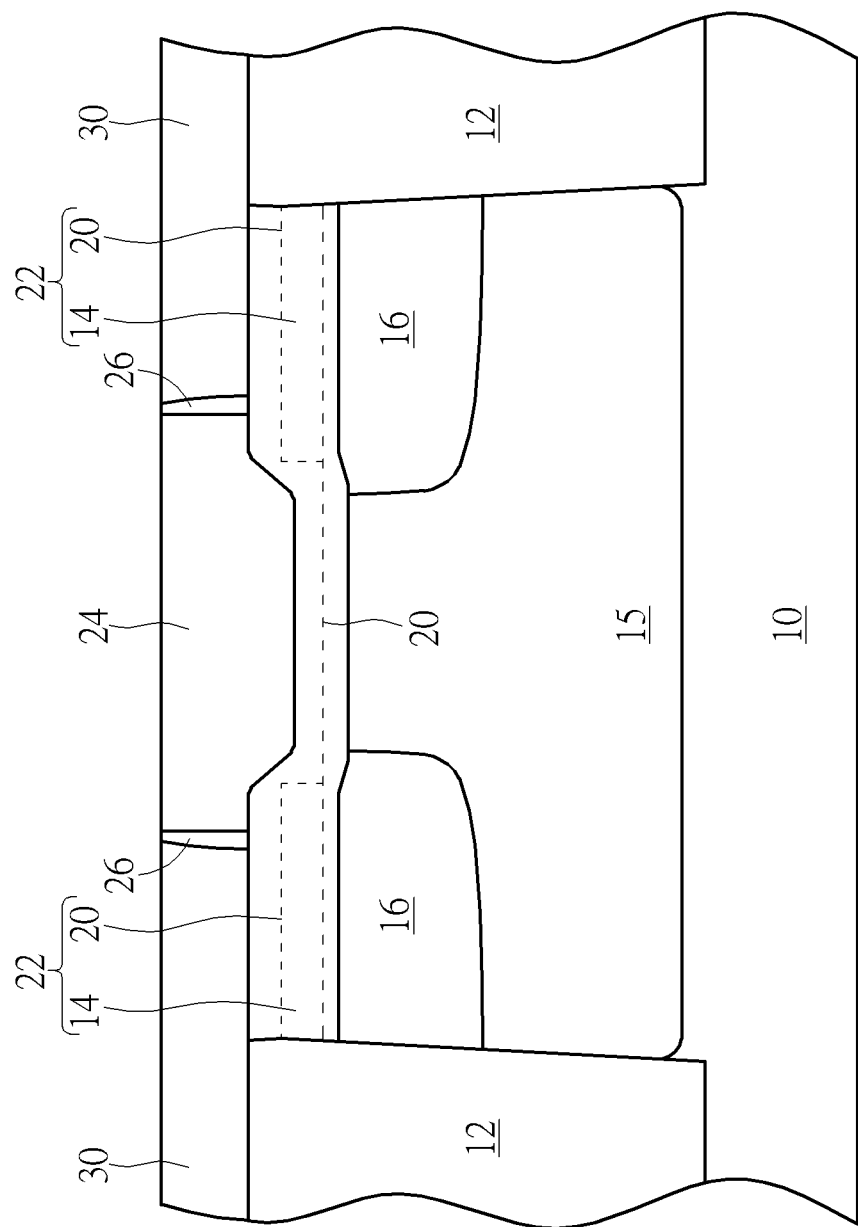

Finally, as shown in FIG. 5, an interlayer dielectric (ILD) 30 may be covered over the gate structure 24 and the spacer 26, and then a planarization step (e.g., a chemical mechanical polishing, CMP) may be performed to remove part of the gate structure 24, parts of the spacer 26 and parts of the interlayer dielectric 30, so that the gate structure 24, the spacer 26 and the interlayer dielectric 30 have a flat top surface after the planarization step is performed. These steps belong to the conventional technology in the field, and will not be described in detail here.

To sum up the above paragraphs and drawings, the present invention provides a semiconductor structure, which comprises a substrate 100, two shallow trench isolation structures 12 located in the substrate 12, first region R1, a second region R2 and a third region R3 are defined between the two shallow trench isolation structures 12, wherein the second region R2 is located between the first region R1 and the third region R3, and two thick oxide layers 22 are respectively located in the first region R1 and the third region R3 and directly contact the two shallow trench isolation structures 12. A thin oxide layer 20 is located in the second region R2, the thickness of the thick oxide layer 22 in the first region R1 is greater than the thickness of the thin oxide layer 20 in the second region R2.

In some embodiments, the thick oxide layer 22 and the thin oxide layer 20 are formed in different steps.

In some embodiments, the thick oxide layer 22 and the thin oxide layer 20 comprise the same material.

In some embodiments, the thickness of the thick oxide layer 22 in the first region R1 is 10% to 30% greater than the thickness of the thin oxide layer 20 in the second region R2.

In some embodiments, the thickness of the thick oxide layer 22 in the third region R3 is equal to the thickness of the thick oxide layer 22 in the first region R1.

In some embodiments, a bottom surface of the thin oxide layer 20 in the second region R2 is lower than a bottom surface of the thick oxide layer 22 in the first region R1.

In some embodiments, a gate structure 24 is further included on the thin oxide layer 20 and the thick oxide layer 22, wherein the gate structure 24 is located in the second region R2 and partially in the first region R1 and the third region R3.

In some embodiments, a doped region (the doped region 15 or the lightly doped region 16) is further included in the substrate 10.

The invention also provides a manufacturing method of semiconductor structure, which comprises providing a substrate 10, forming two shallow trench isolation structures 12 in the substrate 10, a first region R1, a second region R2 and a third region R3 are defined between the two shallow trench isolation structures 12, the second region R2 is located between the first region R1 and the third region R3. An oxide layer 14 is then formed in the first region R1, the second region R2 and the third region R3, and the oxide layer 14 directly contacts the two shallow trench isolation structures 12. The oxide layer 14 is then removed in the second region R2, and another oxide layer 20 is formed in the first region R1, the second region R2 and the third region R3, so that a thick oxide layer 22 is formed in the first region R1 and the third region R3 respectively, and a thin oxide layer 20 is formed in the second region R2.

In some embodiments, the oxide layer 14 is formed simultaneously with the shallow trench isolation structure 12.

In some embodiments, the other oxide layer 20 is formed by a high temperature oxidation step.

In some embodiments, an ion doping step P1 is further performed to form at least one doped region (the doped region 15 or the lightly doped region 16) in the substrate.

In some embodiments, the ion doping step P1 is performed before removing the oxide layer 14 in the second region R2.

Compared with the prior art, the advantages of the invention are as follows: because the DDDMOS will introduce high voltage, therefore, a high current will pass through the DDDMOS. Inventors found that when a high current passes through the gate structure of a DDDMOS, it is easy for the current to pass through the oxide layer below the gate structure, and then affect the gate structure. According to the experimental observation results of the inventor, the electric field and current generated on both sides of the gate structure (near the spacer) are the largest. However, if only the thickness of the whole gate dielectric layer (the oxide layer) is increased, the DDDMOS will be easily affected by the Kirk effect, that is, when large current flows, the transistor is not easy to saturate, and the transistor will become characteristic similar to resistance, which may cause leakage. This will also affect the performance of the DDDMOS.

Therefore, according to the embodiment of the present invention, a part of the buffer oxide layer is left on the left and right sides of the DDDMOS structure near the shallow trench isolation, and when another new oxide layer is subsequently formed, an oxide layer with thinner center and thicker left and right sides will be formed under the gate structure. The thick oxide layers on the left and right sides can effectively protect the gate structure from breakdown by high current, while the central part still has a thin oxide layer, which can also avoid the influence of the Kirk effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor structure, comprising:
    providing a substrate;
    forming two shallow trench isolation structures in the substrate, wherein a first region, a second region and a third region are defined between the two shallow trench isolation structures, wherein the second region is located between the first region and the third region;
    forming an oxide layer in the first region, the second region and the third region, and the oxide layer directly contacts the two shallow trench isolation structures;
    removing the oxide layer in the second region, and the remaining oxide layer is located in the first region and the third region; and
    forming another oxide layer in the first region, the second region and the third region to form a thick oxide layer in the first region and the third region respectively, and forming a thin oxide layer in the second region, wherein the thickness of the thick oxide layer in the first region is greater than the thickness of the thin oxide layer in the second region.

2. The method according to claim 1, wherein the oxide layer is formed simultaneously with the shallow trench isolation structure.

3. The method according to claim 1, wherein the thick oxide layer and the thin oxide layer comprise the same material.

4. The method according to claim 1, wherein the thickness of the thick oxide layer and in the first region is 10%-30% greater than the thickness of the thin oxide layer in the second region.

5. The method according to claim 4, wherein the thickness of the thick oxide layer in the third region is equal to the thickness of the thick oxide layer in the first region.

6. The method according to claim 1, wherein the other oxide layer is formed by a high temperature oxidation step.

7. The method according to claim 6, wherein a bottom surface of the thin oxide layer in the second region is lower than a bottom surface of the thick oxide layer in the first region.

8. The method according to claim 1, further comprising forming a gate structure on the thin oxide layer and the thick oxide layer, wherein the gate structure is located in the second region and partially in the first region and the third region.

9. The method according to claim 1, further comprising performing an ion doping step to form at least one doped region in the substrate.

10. The method according to claim 9, wherein the ion doping step is performed before removing the oxide layer in the second region.

* * * * *